(12) United States Patent
Yamauchi

(10) Patent No.: US 6,842,087 B2
(45) Date of Patent: Jan. 11, 2005

(54) THREE-TERMINAL FILTER USING AREA FLEXURAL VIBRATION MODE

(75) Inventor: Masakazu Yamauchi, Toyama-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 560 days.

(21) Appl. No.: 09/974,979

(22) Filed: Oct. 12, 2001

(65) Prior Publication Data

US 2003/0141945 A1 Jul. 31, 2003

(30) Foreign Application Priority Data

Nov. 9, 2000 (JP) .......................................... 2000-341675

(51) Int. Cl.[7] .............................. H03H 9/54; H03H 9/15
(52) U.S. Cl. ........................ 333/187; 310/357; 310/359; 310/366; 310/368
(58) Field of Search ................................. 333/186–192; 310/357, 359, 366, 368

(56) References Cited

U.S. PATENT DOCUMENTS

| | | | | |
|---|---|---|---|---|
| 3,590,287 A | * | 6/1971 | Berlincourt et al. | 310/321 |
| 3,614,483 A | * | 10/1971 | Berlincourt | 310/321 |
| 5,084,647 A | * | 1/1992 | Inoue et al. | 310/320 |
| 6,563,400 B2 | * | 5/2003 | Itasaka et al. | 333/187 |
| 6,700,302 B1 | * | 3/2004 | Yamamoto et al. | 310/320 |
| 6,744,184 B2 | * | 6/2004 | Funaki | 310/366 |

FOREIGN PATENT DOCUMENTS

| | | |
|---|---|---|
| JP | 3-14824 | 4/1991 |
| JP | 3-21069 | 5/1991 |
| JP | 2001-036376 | 2/2001 |

* cited by examiner

*Primary Examiner*—Barbara Summons
(74) *Attorney, Agent, or Firm*—Keating & Bennett, LLP

(57) ABSTRACT

A three-terminal filter using the area flexural vibration mode is smaller than filters using the area expansion vibration mode or the length vibration mode, and is easily adjusted to produce a desired frequency by changing the thickness and length of the three-terminal filter. The three-terminal filter includes three electrodes having a substantially square shape, and two piezoelectric layers having a substantially square shape, which are alternately laminated. The piezoelectric layers are polarized in the same thickness direction as the thickness direction, or in opposite thickness directions. The three-terminal filter further includes one surface electrode that functions as an input electrode, another surface electrode that functions as an output electrode, and an internal electrode that functions as a ground electrode.

23 Claims, 4 Drawing Sheets

THREE-TERMINAL FILTER USING AREA FLEXURAL VIBRATION MODE

BACKGROUND OF THE INVENTION

1. Field of the Invention

This invention relates to a three-terminal filter using area flexural vibration mode for use in, for example, an AM filter or other suitable apparatus.

2. Description of the Related Art

Conventional three-terminal filters used in a kHz band include a filter using the area expansion vibration mode or a filter using the length vibration mode.

FIG. 1 illustrates an example of an AM three-terminal filter B using the area expansion vibration mode.

In this filter B, a center electrode 11 is provided on the surface of a central portion of a piezoelectric ceramic substrate 10 having a square shape, a ring electrode 12 that surrounds the center electrode 11 is provided on the exterior thereof, and a ground electrode 13 is provided on the entire back surface. An input terminal 11a, an output terminal 12a, and a ground terminal 13a are respectively connected to the center electrode 11, the ring electrode 12, and the ground electrode 13.

FIG. 2 shows a circuit diagram of the three-terminal filter B of FIG. 1.

In the three-terminal filter B using the area expansion vibration mode, the resonance frequency is determined by the length of one side of the three-terminal filter B. For example, if a 40 kHz filter is desired, the length of one side of the filter is 50 mm.

In recent years, miniaturization of electronic devices is increasingly important, and thus, electronic components are also required to be made smaller and thinner. The above-described filter is relatively large and cannot be sufficiently miniaturized. Therefore, the three-terminal filter using the area expansion vibration mode was applicable only for filters having a frequency of about several 100 kHz or more.

In a three-terminal filter using the length vibration mode, as with the filter using the area expansion vibration mode, since the resonance frequency is determined by the shape (length) thereof, size-reduction is very difficult.

SUMMARY OF THE INVENTION

To overcome the above-described problems, preferred embodiments of the present invention provide a three-terminal filter using the area flexural vibration mode that is much smaller than the filters using the area expansion vibration mode or the length vibration mode, and in which the frequency is adjusted by changing the thickness and length of the filter.

Moreover, the three-terminal filter according to preferred embodiments of the present invention achieves lower frequencies than conventional three-terminal filters of equivalent size.

According to preferred embodiments of the present invention, three electrodes having substantially square shapes and two piezoelectric layers having substantially square shapes are alternately laminated. The piezoelectric layers are polarized in the same direction as the thickness direction or in the reverse direction thereof. One surface electrode functions as an input electrode, another surface electrode functions as an output electrode, and an internal electrode functions as a ground electrode. As a result, a three-terminal filter using the area flexural vibration mode is provided.

In a substantially rectangular resonator using the bending vibration mode, a long-side bending vibration mode and a short-side bending vibration mode occur. However, the frequency of the short-side bending vibration mode and the long-side bending vibration mode are approximately equal when the shape thereof is approximately square. When the resonator is substantially square, both the long-side bending vibration mode and the short-side bending vibration mode overlap, thereby generating a very large area flexural vibration mode.

In a resonator using the area flexural vibration mode according to preferred embodiments of the present invention, the piezoelectric layers, in which the direction of the polarization and the direction of the electric field are the same, contract in a direction of a flat surface. The piezoelectric layers, in which the direction of the polarization and the direction of the electric field are reverse, expand. Therefore, an area flexural vibration mode is generated in the resonator. In such a resonator using the area flexural vibration mode, compared with the piezoelectric resonator using the area expansion vibration mode, if both resonators have the same resonance frequency, the size of the resonator using the area flexural vibration mode is much smaller. Conversely, if both resonators are the same size, a filter having a much lower frequency is obtained with the resonator using the area flexural vibration mode.

In a resonator using the area expansion vibration mode, the resonance frequency is determined only by the length of one side. On the other hand, in a resonator using the area flexural vibration mode, the resonance frequency is determined not only by the length of one side, but also by the thickness of the resonator. Therefore, the resonance frequency can be adjusted by changing the side length and the thickness of a resonance element.

Moreover, in the resonator using the area flexural vibration mode, compared with the resonator using the area expansion vibration mode, because the two-layered piezoelectric layers are laminated, even when the overall thickness is the same, the thickness of each piezoelectric layer can be made thinner to be approximately ½ of conventional thicknesses. Therefore, the capacitance between terminals, that is, between the input electrode and the ground electrode, and between the output electrode, and the ground electrode is approximately doubled.

Other features, elements, advantages and characteristics of the present invention will become more apparent from the detailed description of preferred embodiments thereof with reference to the attached drawings.

DETAILED DESCRIPTION OF PREFERRED EMBODIMENTS

Figure 3:
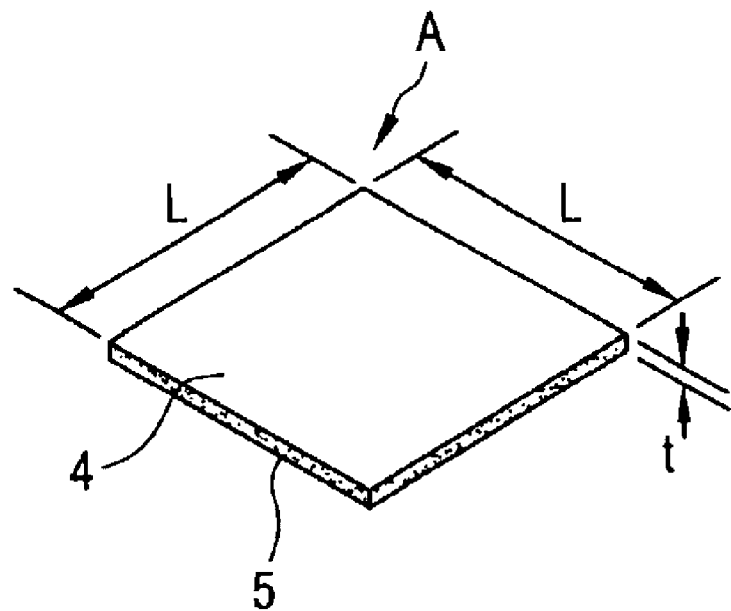
FIG. 3 is a perspective diagram of an example of three-terminal filter according to a preferred embodiment of the present invention.
Figure 4:
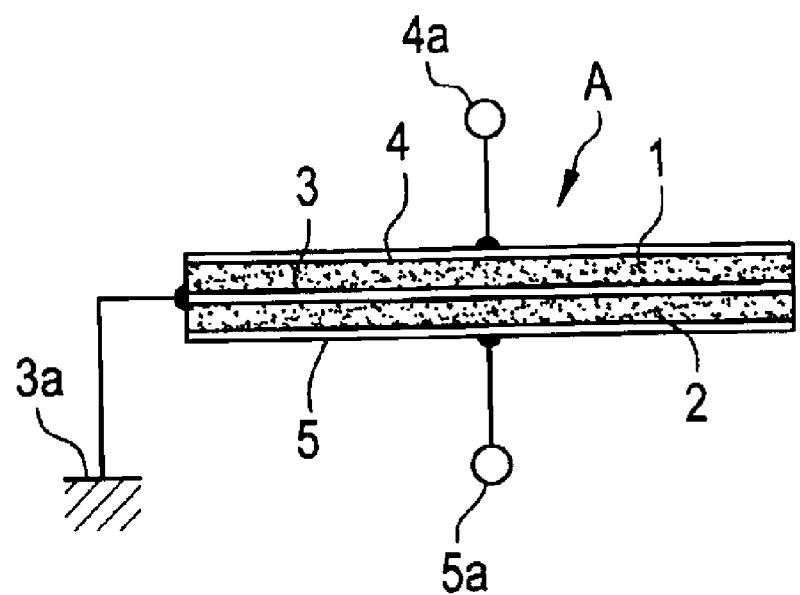
FIG. 4 is a sectional view of three-terminal filter shown in FIG. 3.

FIG. 3 and FIG. 4 illustrate a first preferred embodiment of the three-terminal filter using the area flexural vibration mode according to the present invention.

This filter A preferably includes two piezoelectric layers (piezoelectric ceramics layers) 1 and 2 having a substantially square shape that are laminated with an internal electrode 3 interposed therebetween. Surface electrodes 4 and 5 are respectively provided on exterior main surfaces of the laminated piezoelectric layers 1 and 2. The thickness of both of piezoelectric layers 1 and 2 is preferably approximately the same.

Figure 1:
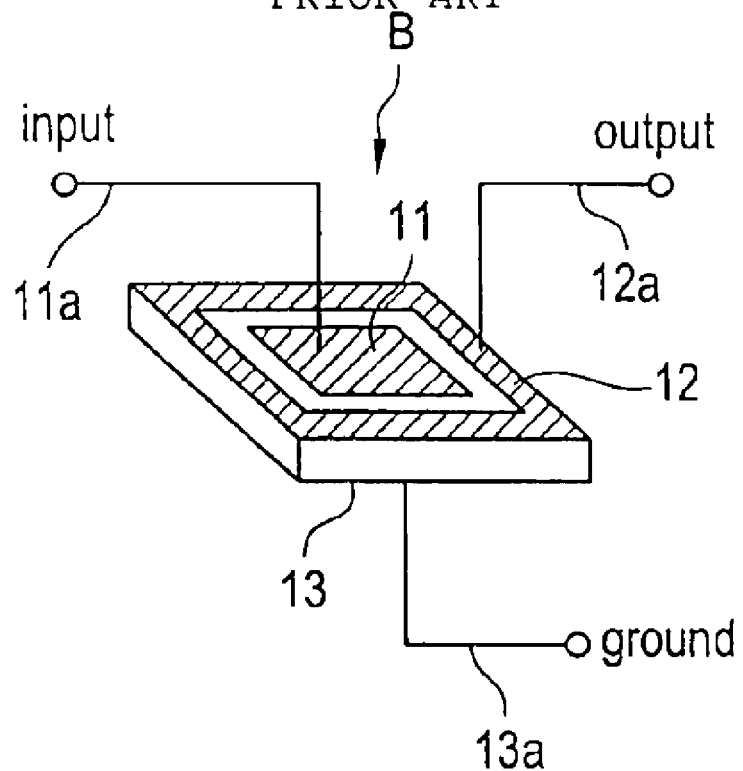
FIG. 1 is a perspective diagram of an example of three-terminal filter using the conventional area expansion vibration mode.
Figure 2:
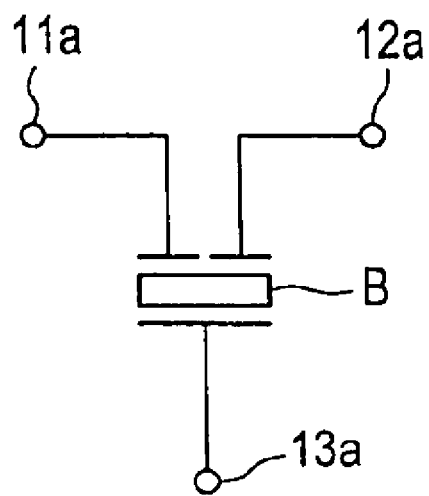
FIG. 2 is a circuit diagram of three-terminal filter shown in FIG. 1.

The internal electrode 3 is connected to a ground terminal 3a, one surface electrode 4 is connected to an input-terminal 4a, and another surface electrode 5 is connected to an output-terminal 5a. A circuit diagram is illustrated in FIG. 2.

Figure 5A:
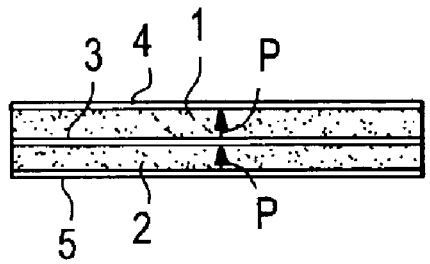
FIG. 5 is a diagram showing the polarization direction of the three-terminal filter shown in FIG. 3.
Figure 5B:
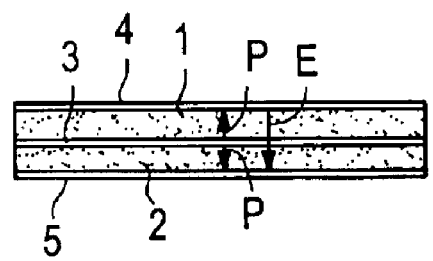
Figure 5C:
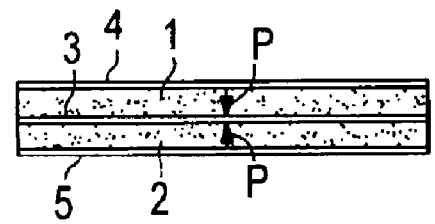

The piezoelectric layers 1 and 2 can be polarized in the same thickness direction as shown in FIG. 5A, in opposite outward-facing directions as shown in FIG. 5B, and in opposite inward-facing direction as shown in FIG. 5C.

For example, as shown in FIG. 5B, in the filter A including piezoelectric layers 1 and 2 which are polarized in opposite directions, when a positive potential is applied to the input-terminal 4a and a negative potential is applied to the output-terminal 5a, the electric-field E is produced in a direction extending from the surface electrode 4 to the surface electrode 5.

Figure 6:
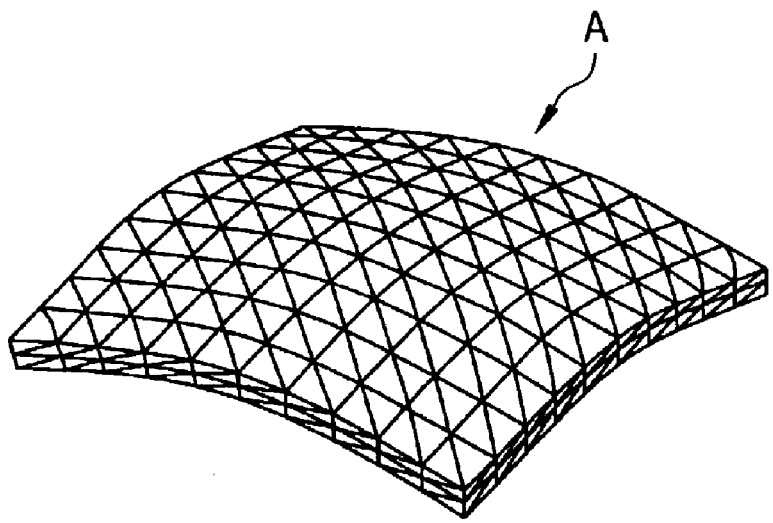
FIG. 6 is a diagram of the three-terminal filter of FIG. 3 using the area flexural vibration mode.

The piezoelectric layer 1, in which the polarization direction is opposite to the electric field direction, expands in the direction of the flat surface. The piezoelectric layer 2, in which the polarization direction is the same as the electric field direction, contracts in the direction of the flat surface. Therefore, as shown in FIG. 6, the filter A bends to become upwardly convex. If the direction of an electric field is reversed, the filter A bends to become downwardly convex. Therefore, if a high-frequency electric field is applied between the input-terminal 4a and the output-terminal 5a, the filter A vibrates in an area flexural mode at a desired frequency.

Figure 7:
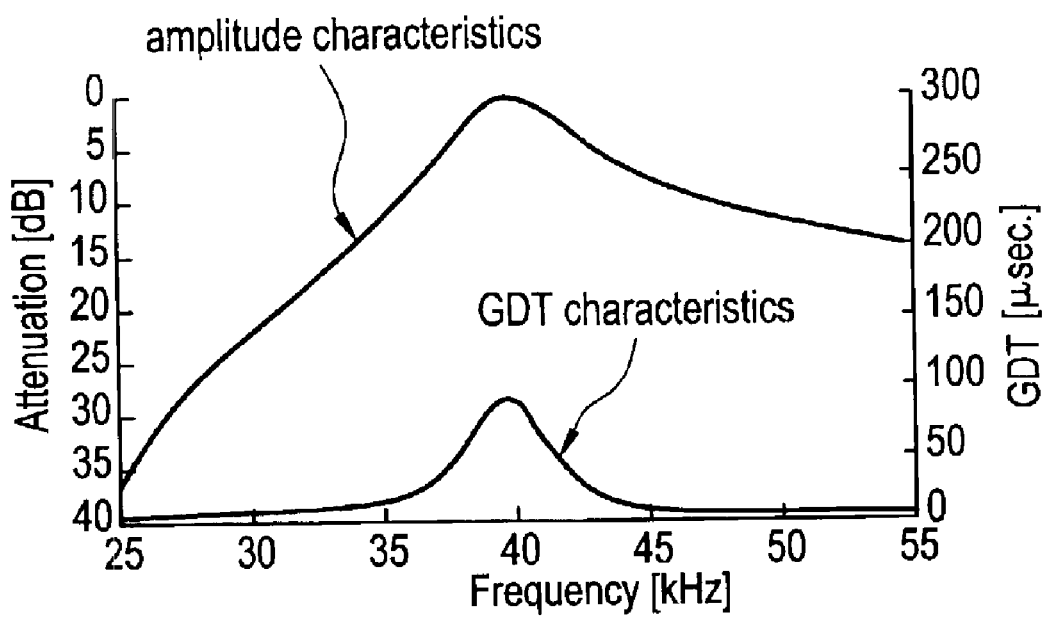
FIG. 7 is a filter characteristic view of the three-terminal filter shown in FIG. 3.

FIG. 7 shows the amplitude characteristics and the group-delay property (GDT) in the filter A according to the first preferred embodiment of the present invention.

As clearly shown from FIG. 7, outstanding filter properties are produced with the filter A.

In a resonator using the area expansion vibration mode, a resonance frequency is determined by only the length of the side, and is not affected by the thickness of the resonator. On the other hand, in a resonator using the area flexural vibration mode, the resonance frequency Fr is determined by the thickness t and the side length L according to the following formula:

$$Fr \propto t/L^2$$

Thus, the resonance frequency Fr is proportional to the thickness t and inversely proportional to the square of the length of the side L.

Figure 8:
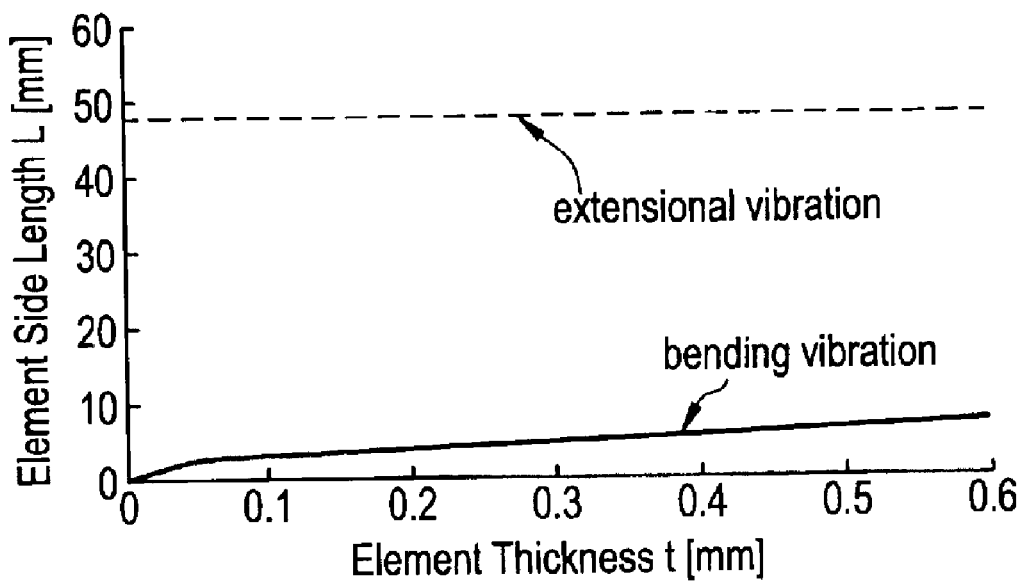
FIG. 8 is a diagram showing the relationship of the thickness and the length of one side of a three-terminal filter using the area flexural vibration mode and a three-terminal filter using the area expansion vibration mode.

In FIG. 8, the element size in the same frequency (Fr=40 kHz) of the filter A using the area flexural vibration mode and the resonator using the area expansion vibration mode is compared.

As illustrated in the diagram, at the identical frequency, an element vibrating in an area flexural mode is approximately ⅕ smaller than an element vibrating in an area expansion mode. Particularly, in the Fr=40 kHz three-terminal filter, the length of one side is about 50 mm in an area expansion mode vibrating element. However, in an area flexural mode vibrating element, the length of one side is about 10 mm or less. Also, if the thickness of an area flexural mode vibrating element is about 0.2 mm or less, the side length of the element is reduced to about 5 mm or less.

Thus, according to preferred embodiments of the present invention, a three-terminal filter including the three electrodes and the two piezoelectric layers are alternately laminated and the piezoelectric layers are polarized in the thickness direction, wherein one surface electrode functions as an input electrode, another surface electrode functions as an output electrode, and an internal electrode functions as a ground electrode. Therefore, the two piezoelectric layers produce an area flexural vibration mode. Thus, the size of filter according to preferred embodiments of the present invention is greatly reduced compared to a filter using an area expansion vibration mode or a filter using a length vibration mode having the same frequency. Conversely, where the filters are the same size, a three-terminal filter having a lower frequency is obtained according to preferred embodiments of the present invention.

Moreover, since the frequency can be adjusted by the changing the thickness and the side length, the three-terminal filter having various frequencies can be obtained.

While the present invention has been described with reference to what are at present considered to be preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A three-terminal filter using the area flexural vibration mode comprising:

at least three electrodes having a substantially square shape; and at least two piezoelectric layers having a substantially square shape; wherein said at least three electrodes and said at least two piezoelectric layers are alternately laminated;

said at least two piezoelectric layers are polarized in a thickness direction; and said at least three electrodes include a first surface electrode located at a first surface of said filter that functions as an input electrode, a second surface electrode located at a second surface of said filter that functions as an output electrode, and an internal electrode located between said at least two piezoelectric layers that functions as a ground electrode.

2. The three-terminal filter according to claim 1, wherein said at least two piezoelectric layers are polarized in the same direction.

3. The three-terminal filter according to claim 1, wherein one of said at least two piezoelectric layers is polarized in a first direction, and another of said at least two piezoelectric layers is polarized in a direction opposite to the first direction.

4. The three-terminal filter according to claim 1, wherein one of said at least two piezoelectric layers is polarized in a direction extending from said first surface towards said internal electrode, and another of said at least two piezoelectric layers is polarized in a direction extending from said second surface toward said internal electrode.

5. The three-terminal filter according to claim 1, wherein one of said at least two piezoelectric layers is polarized in a direction extending from said internal electrode toward said first surface, and another of said at least two piezo-electric layers is polarized in a direction extending from said internal electrode toward said second surface.

6. A three-terminal filter comprising:
    at least three electrodes; and
    at least two piezoelectric layers; wherein
    said at least three electrodes and said at least two piezoelectric layers are alternately laminated;
    said at least two piezoelectric layers are polarized in a thickness direction; and
    said at least three electrodes and said at least two piezoelectric layers are configured to vibrate in an area flexural mode.

7. The three-terminal filter according to claim 6, wherein said at least three electrodes have a substantially square shape.

8. The three-terminal filter according to claim 6, wherein said at least two piezoelectric layers have a substantially square shape.

9. The three-terminal filter according to claim 6, wherein said at least three electrodes include a first surface electrode located at a first surface of said filter that functions as an input electrode, a second surface electrode located at a second surface of said filter that functions as an output electrode, and an internal electrode located between said at least two piezoelectric layers that functions as a ground electrode.

10. The three-terminal filter according to claim 9, wherein one of said at least two piezoelectric layers is polarized in a direction extending from said first surface toward said internal eletrode, and another of said at least two piezoelectric layers is polarized in a direction extending from said second surface toward said internal electrode.

11. The three-terminal filter according to claim 9, wherein one of said at least two piezoelectric layers is polarized in a direction extending from said internal electrode toward said first surface, and another of said at least two piezoelectric layers is polarized in a direction extending from said internal electrode toward said second surface.

12. The three-terminal filter according to claim 6, wherein said at least two piezoelectric layers are polarized in the same direction.

13. The three-terminal filter according to claim 6, wherein one of said at least two piezoelectric layers is polarized in a first direction, and another of said at least two piezoelectric layers is polarized in a direction opposite to the first direction.

14. A filter comprising:
    a plurality of electrodes; and
    a plurality of piezoelectric layers; wherein
    said plurality of electrodes and said plurality of piezoelectric layers are alternately laminated;
    said plurality of piezoelectric layers are polarized in a thickness direction;
    said plurality of electrodes and said plurality of piezoelectric layers are configured to vibrate in an area flexural mode; and
    said plurality of electrode have a substantially square shape.

15. The filter according to claim 14, wherein the filter comprises a three-terminal filter.

16. The filter according to claim 14, wherein said plurality of electrodes includes at least three electrodes.

17. The filter according to claim 16, wherein said at least three electrodes include a first surface electrode located at a first surface of said filter that functions as an input electrode, a second surface electrode located at a second surface of said filter that functions as an output electrode, and an internal electrode located between said plurality of piezoelectric layers that functions as a ground electrode.

18. The filter according to claim 17, wherein one of said plurality of piezoelectric layers is polarized in a direction extending from said first surface toward said internal electrode, and another of said plurality of piezoelectric layers is polarized in a direction extending from said second surface towards said internal electrode.

19. The filter according to claim 17, wherein one of said plurality of piezoelectric layers is polarized in a direction extending from said internal electrode toward said first surface, and another of said plurality of piezoelectric layers is polarized in a direction extending from said internal electrode toward said second surface.

20. The filter according to claim 14, wherein said plurality of piezoelectric layers have a substantially square shape.

21. The filter according to claim 14, wherein said plurality of piezoelectric layers are polarized in the same direction.

22. The filter according to claim 14, wherein one of said plurality of piezoelectric layers is polarized in a first direction, and another of said plurality of piezoelectric layers is polarized in a direction opposite to the first direction.

23. The filter according to claim 14, wherein said plurality of piezoelectric layers includes at least two piezoelectric layers.

* * * * *